United States Patent [19]

Soenen et al.

[11] Patent Number: 6,031,480
[45] Date of Patent: Feb. 29, 2000

[54] METHOD AND APPARATUS FOR IMPLEMENTING A PIPELINED A/D CONVERTER WITH INTER-STAGE AMPLIFIERS HAVING NO COMMON MODE FEEDBACK CIRCUITRY

[75] Inventors: Eric G. Soenen, Plano; Maher Sarraj, Dallas, both of Tex.

[73] Assignee: Texas Instruments Incorporated, Dallas, Tex.

[21] Appl. No.: 08/963,767

[22] Filed: Nov. 4, 1997

[51] Int. Cl.[7] .............................. H03M 1/38; H03F 1/02
[52] U.S. Cl. ................................. 341/161; 330/9
[58] Field of Search .................... 341/156, 172, 341/161, 120, 121, 122, 150; 330/9, 51

[56] References Cited

U.S. PATENT DOCUMENTS

| | | | |
|---|---|---|---|
| 5,274,377 | 12/1993 | Matsuura et al. | 341/161 |
| 5,434,569 | 7/1995 | Yung et al. | 341/172 |
| 5,499,027 | 3/1996 | Karanicolas et al. | 341/120 |
| 5,530,444 | 6/1996 | Tice et al. | 341/156 |
| 5,600,322 | 2/1997 | Garavan | 341/172 |

OTHER PUBLICATIONS

Lewis et al, "A Pipelined . . . Analog to Digital Converter," IEEE Journal of SOlid State Circuits, Dec. 1987.
Soenen et al, ". . . Monolithic Pipelined ADCs," IEEE Transactions on Circuits and Systems, Mar. 1995.

*Primary Examiner*—Michael Tokar
*Assistant Examiner*—Patrick Wamsley
*Attorney, Agent, or Firm*—Alan K. Stewart; Wade James Brady, III; Richard L. Donaldson

[57] ABSTRACT

A pipelined analog-to-digital converter is disclosed having a plurality of sample and hold converter stages, each having an interstage amplifier (28) associated therewith. This is a differential amplifier that is implemented without common-mode feedback. The sample and hold stage operates on a reset phase and a gain/DAC phase, wherein the output of the reconstructive DAC is summed with the input to the amplifier (28). A differential input amplifier (60) has the inputs thereof set to common-mode input voltage with a feedback capacitor biased to a common-mode output bias point. During the gain/DAC phase, the bias input is removed and the feedback capacitor connected across the input/output of the amplifier (60). This effectively establishes the common-mode bias points for use by the amplifier (60) during the gain/DAC phase. Further, the differential inputs of the amplifier (60) are connected to one side of respective sampling capacitors, the other side thereof connected through a respective switch to the differential inputs. During the reset phase the input voltage is sampled onto the capacitors and, during the gain/DAC phase, the gates of the capacitors are connected together to remove any common-mode voltage from the input prior to being input to the amplifier (60).

6 Claims, 4 Drawing Sheets

METHOD AND APPARATUS FOR IMPLEMENTING A PIPELINED A/D CONVERTER WITH INTER-STAGE AMPLIFIERS HAVING NO COMMON MODE FEEDBACK CIRCUITRY

TECHNICAL FIELD OF THE INVENTION

The present invention pertains in general to data conversion devices and, more particularly, to a pipelined analog-to-digital converter and the interstage amplifier associated therewith.

BACKGROUND OF THE INVENTION

Data conversion devices of the type utilizing analog-to-digital converters are utilized primarily for the purpose of quantizing analog signals for use in digital signal processing thereof As the need for more powerful digital signal processing systems increases, the need for higher resolution ADCs increases. However, this increase in resolution also requires the ADCs to provide a much higher level of accuracy.

Most ADCs utilize switched capacitor elements and differential amplifiers. These switched capacitor elements, in order to obtain the necessary accuracy, must be accurately matched. Of course, this then requires the manufacturing process to achieve high levels of accuracy, which are sometimes difficult due to matching limitations between components, which components are fundamentally related to each other in an ADC algorithm by ratios therebetween. Since these limitations usually exceed the process capabilities, various calibration techniques are then implemented.

One type of ADC that has overcome some of the disadvantages noted above is the pipelined analog-to-digital converter. This type of ADC has some advantages over the flash or successive approximation techniques due to potentially high resolution and high speed that can be achieved at the same time. These converters use a plurality of converter stages, each converter stage involving a sub-ADC and a reconstructing digital-to-analog (DAC) converter. In addition, there is a gain element associated with each converter stage in the analog domain. The data conversion techniques utilize a plurality of switched capacitor elements, the output of which is an analog signal that is typically input to a differential interstage amplifier stage to provide the gain element. The implementation of the interstage amplifier utilizing a fully differential amplifier yields superior performance in power supply rejection. However, this is achieved with an interstage amplifier that utilizes common-mode feedback circuitry. This circuitry typically increases area, power and complexity, in addition to introducing parasitics, with a noted decrease in stability and speed.

SUMMARY OF THE INVENTION

The present invention disclosed and claimed herein comprises a pipelined analog-to-digital converter. The pipelined analog-to-digital converter includes a plurality of converter stages, each for receiving a differential analog input and generating a local digital code, representing a coarse digital value of the analog input signal, and then generating a differential analog residue output signal that represents the difference between the received differential analog input signal and the coarse digital value. A digital correction circuit is then operable to receive all of the local digital codes from each of the converter stages, and generate the digital output of the pipelined analog-to-digital converter. Each of the converter stages includes a sample/hold interstage differential amplifier. The interstage differential amplifier operates with a reset phase, with sampling circuits for sampling the differential analog residue signal during the reset phase. It also has a gain phase. The interstage differential amplifier has a differential input for receiving the unamplified differential analog residue signal generated internal to the converter stage during the reset phase for sampling thereof, and then operates in the gain phase to amplify the sampled differential analog residue signal to provide gain thereto. The interstage differential amplifier has a common-mode bias circuit for setting the input bias voltage level thereto only during the reset phase.

In another aspect of the present invention, the interstage differential amplifier has associated therewith positive and negative differential inputs and wherein the common-mode bias circuit includes a voltage generator for generating a common-mode input voltage reference. A switching circuit is then provided for connecting the common-mode input voltage reference to the positive and negative differential inputs during the reset phase. The interstage differential amplifier also has associated therewith positive and negative differential outputs. The common-mode bias circuit is operable to set the output bias voltage during the reset phase on each of the positive and negative differential outputs.

In a further aspect of the present invention, the interstage differential amplifier has a feedback capacitor associated with each of the positive and negative differential inputs, with one end of each of the feedback capacitors connectable to the associated one of the positive and negative differential inputs, the output thereof connectable to the associated one of the positive and negative outputs of the interstage differential amplifier. The bias circuit includes a first switch network for connecting the positive and negative differential inputs to a common-mode input voltage reference. The first switch network provides a bias point to the positive and negative inputs. A second switch network is provided for connecting the other side of each of the feedback capacitors associated with the positive and negative differential inputs to a common-mode output voltage reference to set the bias output level of the interstage differential during the gain phase. A switch control then controls the first and second switch networks to connect the common-mode input voltage reference and the common-mode output voltage reference to the respective ones of the first and second switch modes, only during the reset phase.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
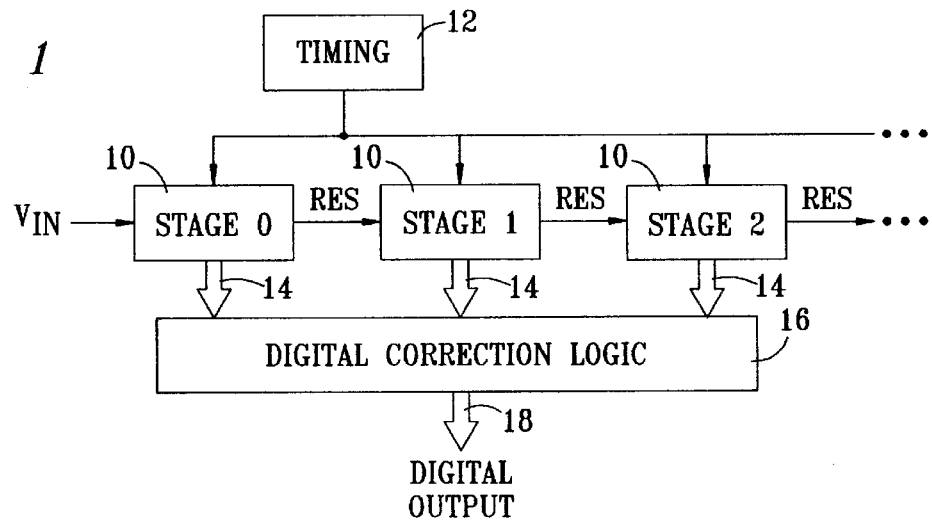
FIG. 1 illustrates a block diagram of a pipelined analog-to-digital converter operating in accordance with the present invention.

Referring now to FIG. 1, there is illustrated a block diagram of a data conversion device utilizing a pipelined architecture. This pipelined architecture utilizes a plurality of multiply-by-two converter stages 10, arranged in a pipelined configuration, with the first of the stages 10 receiving an analog input voltage $V_{in}$ and outputting a residue analog signal. However, the gain could be a value different from two, but must be greater than one. The residue of each converter stage 10 after stage zero receives on the input thereof the residue analog signal from the previous converter stage 10. Each of the converter stages 10 receives timing signals from a 10 timing block 12. Each of the converter stages 10 also outputs a 2-bit digital output, often referred to as a local output, on a 2-bit bus 14. Each of the buses 14 is input to a digital correction logic block 16 to provide a digital output on a bus 18, the digital output representing the conversion result of the data conversion device. The operation of the pipelined architecture is generally described in E. G. Soenen and R. L. Geiger, "An Architecture and An Algorithm for Fully Digital Correction of Monolithic Pipelined ADC's," IEEE Transactions On Circuits and Systems, vol. 42, No. 3, March 1995, pages 143–153, which article is incorporated herein by reference. Additionally, the operation of the pipelined ADC is also described in U.S. Pat. No. 5,499,027, issued to A. N. Karanicolas et al., on Mar. 12, 1996, which patent is incorporated herein by reference.

Figure 2:
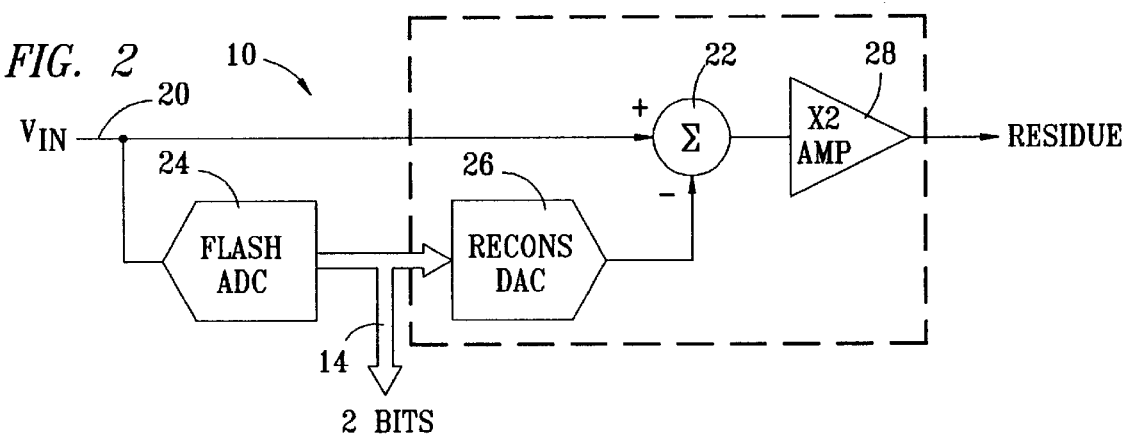
FIG. 2 illustrates-a block diagram of one stage of the pipelined architecture.

Referring now to FIG. 2, there is illustrated a more detailed logic diagram of each of the converter stages 10. The input signal is received on a node 20, which node 20 is input to the positive input of a summing junction 22. The input voltage on node 20 is also input to the input of a flash ADC 24, the output thereof comprising the 2-bit output on the bus 14. This digital value then becomes an input to a reconstruction DAC 26, the digital output thereof comprising an input to the negative input of the summing junction 22. The summing junction output from summing junction 22 comprises the input to an interstage amplifier 28, the output of which comprises the residue signal. Although not illustrated as such, it should be understood that the input signal on node 20 is a differential voltage and the amplifier 28 is a differential amplifier.

In operation, the input signal is compared against a number of reference levels, $V_{ref}$ with the flash ADC 24 to provide a rough digital representation of the input voltage on the bus 14. This is sometimes referred to as a "thermometer format." This in general is referred to as the "local code" for the particular converter stage 10. This rough approximation is then converted to an analog value and subtracted from the analog input signal for that converter stage 10, and then multiplied by a factor of two by amplifier 28 before input to the next converter stage 10. The local codes in the present embodiment is a two bit value. The digital correction block 16 is operable to take the weighted sum of these local codes to generate the output in the following manner:

$$D_{OUT} = V_{DAC}^1 + \frac{V_{DAC}^2}{A_1} + \frac{V_{DAC}^3}{A_1 A_2} + \ldots$$

where: $A_1, A_2, \ldots$ is the gain of the successive stages
$V_{DAC}$ is the output of the reconstructing DAC With the two bit local code, the digital correction block 16 will sum the adjacent bits of the local code of adjacent stages and provide a binary output therefore, with the CSB bit of the last stage being the LSB of the output and the MSB of the output being the sum of the MSB of the first stage and possible carry bits generated by the summation.

Figure 3:
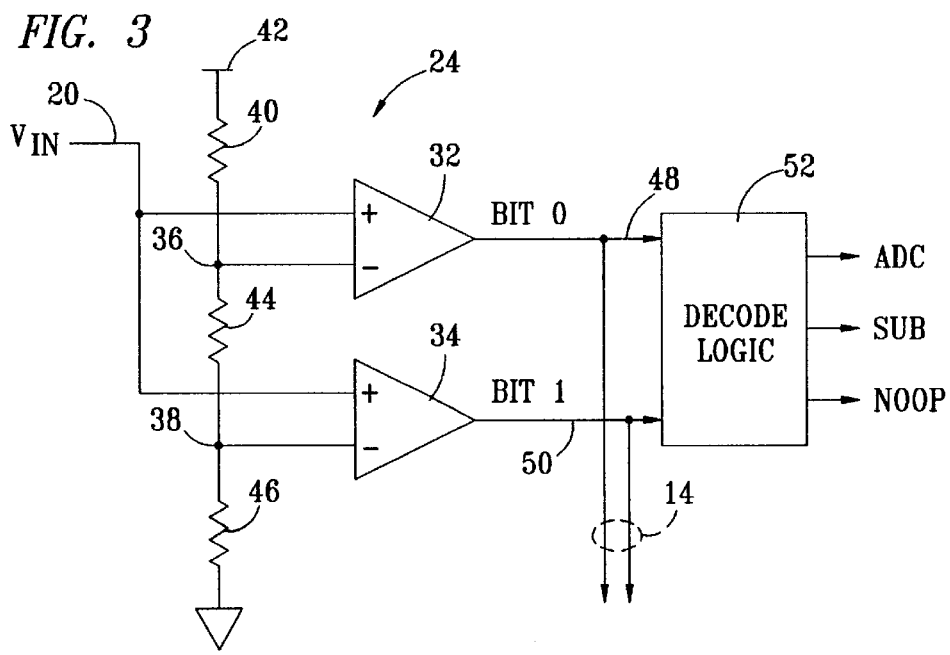
FIG. 3 illustrates a block diagram of the flash ADC.

Referring now to FIG. 3, there is illustrated a block diagram of the flash ADC 24. The flash ADC 24 is comprised of two comparators, a comparator 32 and a comparator 34, comparator 32 having the negative input thereof connected to a reference voltage node 36, and the positive input thereof connected to the input node 20. Comparator 34 has the negative input thereof connected to a reference voltage node 38 and the positive input thereof connected to the input voltage node 20. The reference voltages on nodes 36 and 38 are derived with a voltage divider comprised of a resistor 40 connected between a positive voltage rail 42 and the reference node 36, a resistor 44 connected between reference voltage nodes 36 and 38, and a resistor 46 connected between reference voltage node 38 and ground. The comparator 32 will output the Bit-zero digital value on a node 48 and a comparator 34 will output a Bit-one value on a node 50, both nodes 48 and 50 comprising a 2-bit output on bus 14. These are input to a decode logic block 52 which will provide three output states, an ADD output, a SUB output and an NOOP output. For M comparators, there are M+1 possible codes, this being three in the present embodiment. Depending upon the local code, i.e., the value on the bus 14, one out of M+1 possible voltages, $V_{DAC}$, is subtracted from the input signal. In the given example, the value of M is two.

The difference signal ($V_{in}-V_{DAC}$) is then amplified by the interstage amplifier 28, which interstage amplifier 28 is a sample/hold (S/H) amplifier. This amplifier has a gain, A, which restores the difference signal to a level compatible with the input range of the next stage. In the preferred embodiment, this gain is a factor of two. The resulting signal is then called the residue, $V_{res}$. The S/H action allows several stages to be cascaded in the pipelined fashion illustrated in FIG. 1. Cascading additional stages will provide for a higher resolution.

Figure 4:
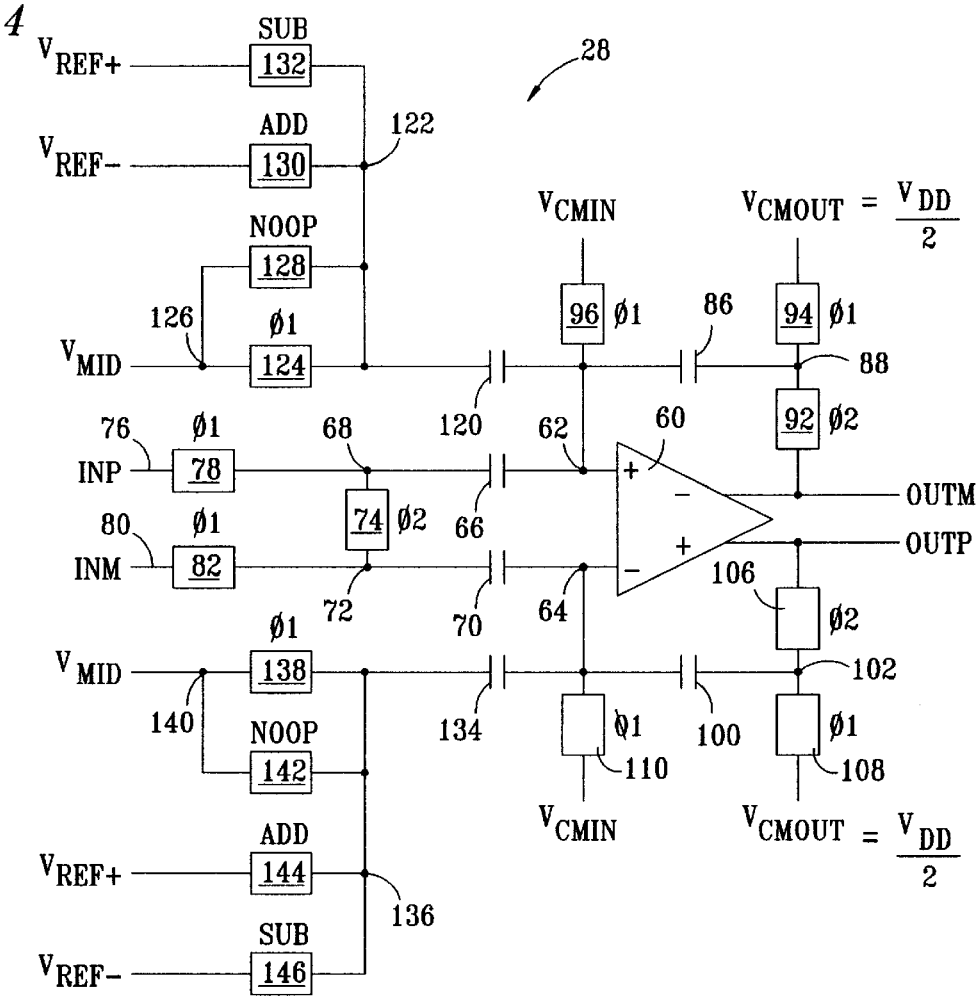
FIG. 4 illustrates a block diagram of the interstage amplifier.

Referring now to FIG. 4, there is illustrated a circuit diagram of the interstage amplifier 28. At the center of the interstage amplifier 28 is a differential amplifier 60 which, as will be described hereinbelow, does not have any common-mode feedback circuitry associated therewith. The amplifier 60 is an inverting amplifier with a positive and negative input and a positive and negative output, the positive input connected to a node 62 and the negative input thereof connected to a node 64. An input capacitor 66 is connected between the node 62 and a node 68 on the positive side. Similarly, a capacitor 70, equal to the capacitor 66, is connected between node 64 and a node 72. A switch 74 is connected between nodes 68 and 72. Although illustrated as a block, the switch 74 is typically an MOS gate, comprised of a P-channel transistor and an N-channel transistor, having the source/drain paths thereof connected in parallel with the signal driving the N-channel transistor being the opposite in polarity of that driving the P-channel transistor. This is a conventional configuration and, therefore, all of the switches described hereinbelow will be represented by a box and it should be understood that they are comprised of such a gated structure or any equivalent thereof The node 68 is connected to a positive signal input node 76 through a switch 78 and minus signal input node 80 is connected to the node 72 through a switch 82. The switches 74, 78 and 82 are switches that are "clocked," that is, they are not either continually on or continually off Further, they are clocked by clock signals $\phi 1$ or $\phi 2$. The switch 74 is clocked by the clock signal $\phi 2$, with switches 78 and 82 clocked by $\phi 1$.

The amplifier 60 has a feedback structure associated with both the positive side and the negative side thereof. On the positive side, a feedback capacitor 86 is connected between the positive node 62 and a node 88. Node 88 is connected to the negative output of the amplifier 60 on a node 90 through a switch 92, switch 92 clocked by $\phi 2$. Node 88 is also connected to a voltage $V_{cmout}$ through a switch 94 clocked by $\phi 1$. The voltage $V_{cfout}$ is a bias voltage and is set at $V_{DD}/2$ in the preferred embodiment. The node 62 is connected to a common-mode input voltage $V_{cmin}$ through a switch 96 clocked by $\phi 1$.

In a similar fashion, a feedback capacitor 100 is associated with the negative side of the amplifier 60 and is connected between the negative input node 64 and a node 102. Node 102 is connected to the positive output of the amplifier 60 on a node 104 through a switch 106 clocked by $\phi 2$. Node 102 is connected to the common-mode output voltage $V_{cmout}$ through a switch 108 clocked by $\phi 1$. Node 64 is connected to the input common-mode voltage $V_{cmin}$ through a switch 110 clocked by $\phi 1$.

Figure 5:
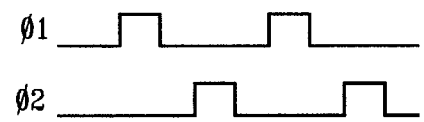
FIG. 5 illustrates a timing diagram for the two different phase clocks.

Referring now to FIG. 5, there is illustrated a clock diagram for the clock signals $\phi 1$ and $\phi 2$. It can be seen that they are non-overlapping, such that $\phi 1$ has associated therewith pulses that do not overlap the pulses associated with the clock signal $\phi 2$. These clock signals are utilized to drive the switches noted hereinabove with respect to FIG. 4.

In operation of the interstage amplifier 28, the first step must be to set the bias voltages. Upon the $\phi 1$ clock going high, this will connect the input nodes 62 and 64 to the common-mode input voltage $V_{cmin}$, this ensuring that input nodes 62 and 64 are substantially identical, thus resulting in a "virtual ground" and at an appropriate operating bias level. At the same time, the other plate of each of the capacitors 66 and 70 are connected through respective switches 78 and 82 to the respective differential input nodes 76 and 80. At the same time, the other plate of capacitors 86 and 100 is connected to the common-mode output voltages $V_{cmout}$ through switches 94 and 108, respectively. Of course, at this time, the negative output node 90 and the positive output node 104 are disconnected from the nodes 88 and 102, respectively, and thus, the state is essentially unknown for these outputs. However, as will be described hereinbelow, this is not important during the $\phi 1$ clock phase.

In effect, by forcing the inputs 62 and 64 to a common-mode input voltage and nodes 88 and 102 to a common-mode output voltage, a later operation will make this common-mode output voltage the effective bias voltage on the output nodes 90 and 104. This is effected on the $\phi 2$ clock cycle. At this time, the nodes 88 and 102 are connected through switches 92 and 106, respectively, to nodes 90 and 104. This effectively places the output of the amplifier 60 at a $V_{cmout}$, a mid-range voltage, i.e., $V_{DD}/2$. At the same time, switch 74 is closed, with switches 78 and 82 open. This will then transfer the voltage on capacitors 66 and 70 over to nodes 62 and 64. However, the switch 74 has an added benefit in that it will remove any common-mode voltage on the input nodes 76 and 80, such that only the differential voltage is transferred to the nodes 62 and 64. This will result in the difference being amplified by the gain of the amplifier 60 for output on the differential output nodes 90 and 104.

The summing operation noted hereinabove with respect to summing junction 22 in FIG. 2 and the operation of the reconstructive DAC 26 is facilitated by a structure connected to the positive input node 62 and the negative input node 64. On the positive input node 62, there is connected thereto one side of a DAC capacitor 120, the other side thereof connected to a node 122. It is noted that the DAC capacitor 120 is separate from capacitor 66, such that the summing operation of the DAC output is performed at node 62. Although the summing operation could have been achieved by inputting node 122 directly to node 68 and utilized capacitor 66, this would have defeated the common-mode rejection provided by the operation of switch 74. By utilizing a separate DAC capacitor 102 from the input capacitor 66, the common-mode rejection on the input signal can be maintained.

A plurality of switches are connected between node 122 and various reference voltages. A first switch 124 is connected between node 122 and a node 126, node 126 connected to a mid-level voltage $V_{mid}$. Switch 124 is clocked by $\phi 1$. A second switch 128 is connected between node 122 and node 126, switch 128 controlled by the NOOP signal output by the code logic block 52. A third switch 130 is connected between node 122 and a positive reference voltage $V_{ref-}$, switch 130 controlled by the ADD signal output by the code logic block 52. A fourth switch 132 is connected between node 122 and a negative reference voltage $V_{ref+}$, switch 132 controlled by the SUB signal output by the code logic block 52. The mid-level voltage $V_{mid}$ is midway between the positive and the negative reference voltages.

In a similar manner described with respect to the positive side of the amplifier 60, the negative input node 64 is connected to one side of a DAC capacitor 134, the other side thereof connected to a node 136. Node 136 is connected to the various voltages $V_{mid}$, $V_{ref+}$, and $V_{ref-}$. A first switch 138 is connected between node 138 and a node 140, node 140 connected to the mid-level voltage $V_{mid}$. Switch 138 is clocked by the clock $\phi 1$. A second switch 142 is connected between the node 136 and the node 140 and controlled by the NOOP signal from the decode logic block 52. A third switch 144 is connected between the node 136 and the negative reference voltage $V_{ref+}$, and controlled by the ADD output of decode logic block 52. A fourth switch 146 is connected between the node 136 and the positive reference voltage $V_{ref-}$, and controlled by the SUB output of the decode logic block 52.

In operation of the DAC portion, the capacitor 120 and the capacitor 134 have the plates thereof on the respective nodes 122 and 136 connected to the mid-level voltage $V_{mid}$ by the respective switches 124 and 138. This occurs during the time that the nodes 62 and 64 are connected to common-mode input voltage $V_{cmin}$. On the next clock cycle, the $\phi 2$ cycle, the decode block 52 is operable to connect one of the three voltages $V_{mid}$, $V_{ref-}$ and $V_{ref+}$, to the respective plate of the capacitors 120 and 134. The DAC will be controlled to perform three operations. In the first operation, an addition operation, the DAC will connect the $V_{ref-}$ voltage to the one plate of the capacitor 120 and the $V_{ref+}$ to the one plate of the capacitor 134. This effectively adds the differential voltage. In a subtract operation, the voltage $V_{ref+}$ is added to the one plate of the capacitor 120 and the $V_{ref-}$ is added to the one plate of the capacitor 134.

Figure 6:
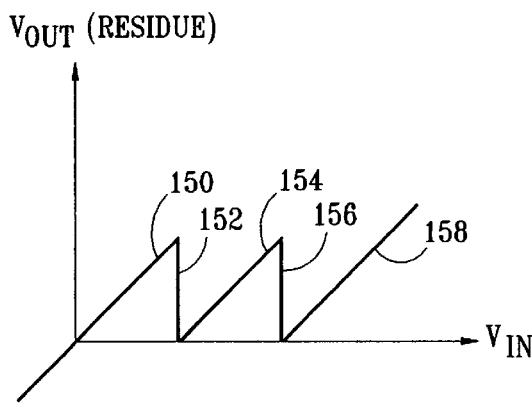
FIG. 6 illustrates a waveform of the input voltage versus the residue voltage on the output of the interstage amplifier.

With respect to FIG. 6, the voltage output from the amplifier 60 can be illustrated as a function of the input voltage. As the input voltage increases in value while still below the first reference voltage on node 38 of the flash ADC of FIG. 2, the output voltage will rise as indicated by a curve 150. At a first threshold, the DAC value will change, as indicated by a transition 152, indicating an offset. The voltage will again rise, as indicated by a curve 154, until the second threshold on node 36 of the flash ADC 24 of FIG. 2 is reached, this being represented by a transition 156. Thereafter, the voltage will continue to rise, as indicated by a line 158. Again, this is a conventional operation.

Figure 7:
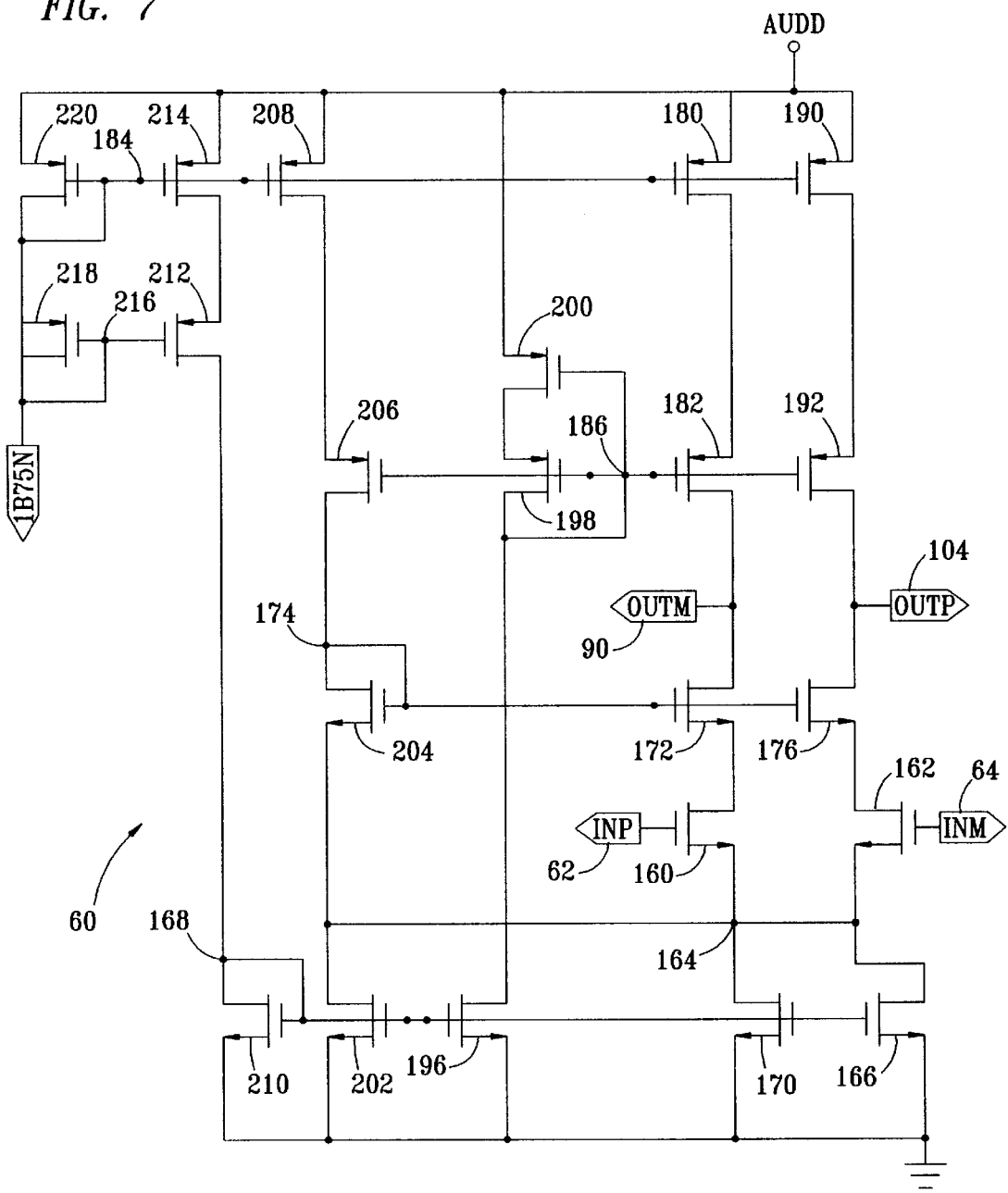
FIG. 7 illustrates a detailed circuit diagram of the interstage amplifier of FIG. 4, wherein a differential input is utilized with no common-mode feedback.

Referring now to FIG. 7, there is illustrated a schematic diagram of one embodiment of the amplifier 60. A pair of differential input N-channel transistors 160 and 162 are provided having the sources thereof connected to a common source node 164, with the gate of transistor 160 connected to the positive input node 62 and the gate of the transistor 162 connected to the negative input node 64. Node 164 is connected to the drain of an N-channel transistor 166, the source thereof connected to ground and the gate thereof connected to a node 168. Similarly, a second N-channel transistor 170 is connected in parallel through transistor 166, with the source/drain path thereof connected between node 164 and ground and the gate thereof connected to node 168. The drain of transistor 160 is connected to the source of an N-channel cascode transistor 172, the gate thereof connected to a node 174 and the drain thereof connected to the negative output terminal 90. Similarly, the drain of transistor 162 is connected to the source of an N-channel cascode transistor 176, the gate thereof connected to the node 174 and the drain thereof connected to the positive output terminal.

The negative output of terminal 90 has a P-channel load transistor 180 associated therewith with the source/drain path thereof connected in series with the source/drain path of a P-channel cascode transistor 182, the other side of the source/drain path of the transistor connected to the positive rail, and the other side of the source/drain path of cascode transistor 182 connected to the negative output terminal 90. The gate of transistor 180 is connected to a node 184 and the gate of cascode transistor 182 is connected to a node 186. In a similar fashion, the positive output terminal 104 is associated with a P-channel load transistor 190, the source/drain path thereof connected between the positive rail and the other side thereof connected in series with the source/drain path of a P-channel cascode transistor 192, the other side of the source/drain path of cascode transistor 192 connected to the positive output terminal 104. The gate of transistor 190 is connected to the node 194 and the gate of transistor 192 is connected to the node 186.

A first leg associated with the bias circuitry is comprised of an N-channel transistor 196 having the source thereof connected to ground, the gate thereof connected to the node 168, and the drain thereof connected to the node 186. A P-channel transistor 198 has the source/drain path thereof connected in series with the source/drain path of a P-channel transistor 200, the gates of both transistors 198 and 200 connected to node 186, and the other side of the source/drain path of transistor 200 connected to the supply terminal. A second leg in the bias network is comprised of an N-channel transistor 202 having the source thereof connected to ground, the gate thereof connected to the node 168, and the drain thereof connected to the node 164. An N-channel transistor 204 has the source thereof connected to node 164 and the gate and drain thereof connected to node 174. A P-channel transistor 206 has the source/drain path thereof connected between the node 174 and the other side thereof connected in series with the source/drain path of a P-channel transistor 208, the gate of transistor 206 connected to the node 186. The other side of the source/drain path of transistor 208 is connected to the supply terminal and the gate thereof connected to node 184. A third bias leg is provided with an N-channel transistor 210, the source thereof connected to ground and the gate and drain thereof connected to node 168. Node 168 is also connected to one side of the source/drain path of a P-channel transistor 212, the other side thereof connected in series with the source/drain path of a P-channel transistor 214. The gate of transistor 212 is connected to a node 216. The other side of the source/drain path of transistor 214 is connected to the supply terminal and the gate thereof connected to node 184. Node 216 is connected to the gate of a diode-configured P-channel transistor 218, which has a source/drain path thereof connected between node 216 and the node 184. A second diode-configured P-channel transistor 220 is connected between node 184 and the positive rail. Node 216 is connected to an external current source (not shown) which sets the current through transistors 220 and 218. This current is mirrored over to the leg comprised of transistors 210, 212 and 214. Additionally, this sets the bias on node 184, with transistor 210 setting the bias on node 168.

It can be seen that, without common-mode feedback, the amplifier 60 of FIG. 7 in and of itself does not have any way to set the output terminals 90 and 104 to a midpoint. This is facilitated by initially setting the input terminals 62 and 64 to a predetermined common-mode input voltage, $V_{cmin}$. This effectively sets the bias point for the input transistors. In the initial set-up, it is not important for the output terminals 90 and 104 to reside at any particular voltage, since the feedback capacitors 86 and 100 are not connected. As such, the gain is very high. Once the capacitors 86 and 100 are connected, the ratio thereof is set such that the gain is a factor of two. Of course, as described hereinabove, the capacitors 86 and 100 have a voltage disposed on the one plate thereof at a voltage of $V_{DD}/2$. When these capacitors 86 and 100 are connected, the gain of the amplifier 60 will be set and the nodes 90 and 104 will be disposed at the voltage $V_{DD}/2$ (assuming that the difference between the input terminals 76 and 80 is zero). Of course, if there is a differential voltage or an offset in the amplifier, this voltage will cause the output terminals 90 and 104 to also have a correspondingly higher differential voltage there across. In most cases, this is not a problem, since the differential voltage is small. It can be considered an offset, to which the ADC is not sensitive.

Figure 8:
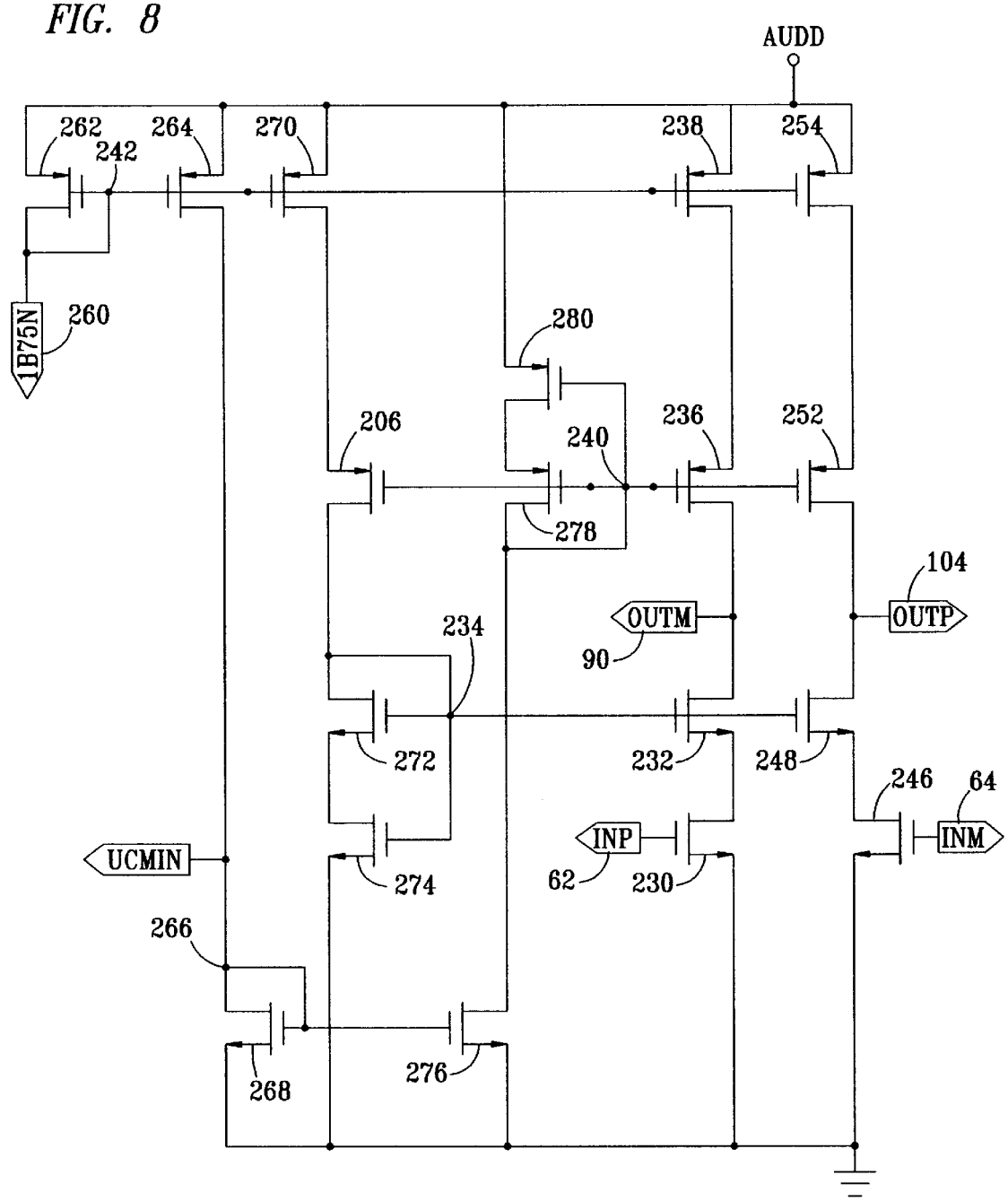
FIG. 8 illustrates a more detailed circuit diagram of the interstage amplifier of FIG. 4 with no common-mode feedback and no differential input pair.

Referring now to FIG. 8, there is illustrated a preferred embodiment of the present invention utilizing no common-mode feedback and no differential input pair. There is provided a positive leg and a negative leg in the amplifier 60 of FIG. 8. The positive leg has an N-channel transistor 230 with the source thereof connected to ground, the gate thereof connected to the input terminal, and the drain thereof connected to the source of a cascode N-channel transistor 232. The gate of transistor 232 is connected to a node 234 and the drain thereof connected to the negative output terminal 90. The negative output terminal 90 is also connected to one side of the source/drain path of a cascode P-channel transistor 236, which is connected in series with the source/drain path of a P-channel transistor 238, the other side thereof connected to the positive supply terminal. The gate of transistor 236 is connected between node 240 and the gate of transistor 238 is connected to a node 242. The negative leg has an N-channel input transistor 246, the source thereof connected to ground and the gate thereof connected to the source of an N-channel cascode transistor 248. The gate of transistor 246 is connected to the negative input terminal 64 and the gate of transistor 248 is connected to the node 234, the drain of transistor 248 connected to the negative output terminal 104. The negative output terminal 104 is also connected to one side of the source/drain path of a P-channel cascode transistor 252, the other side thereof connected in series with the source/drain path of a P-channel load transistor 254. The other side of the source/drain path of transistor 254 is connected to the positive supply terminal, with the gate thereof connected to the node 242. The gate of transistor 252 is connected to the node 240.

Bias is provided for the positive and negative legs through a current source input terminal 260, which is connected to one side of a diode-connected P-channel transistor 262, the other side of the source/drain path thereof connected to the positive terminal, the input terminal 260 also connected to the node 242. The current through transistor 262 is mirrored over to a first bias leg comprised of a P-channel transistor 264 having the gate thereof connected to node 242 and the source/drain path thereof connected between the positive supply terminal and a node 266. Node 266 is connected to the drain and gate of a diode-connected N-channel transistor 268, the source thereof connected to ground. Therefore, the current through transistor 262 is mirrored through to the transistors 264 and 268. The node 242, which is connected to the gate of transistor 264 as noted above, is also connected to the gates of transistors 238 and 254 to provide the bias therefor. Additionally, the node 242 is connected to the gate of a P-channel transistor 270, which is disposed in another bias leg associated with cascode N-channel transistors 232 and 248. The source/drain path of P-channel transistor 270 is connected between the power supply node and the node 234. Node 234 is connected to one side of a diode-connected N-channel transistor 272 with the gate and drain thereof connected together and the source thereof connected to the drain of an N-channel transistor 274, the gate of transistor 274 connected to the node 234 and the source thereof connected to ground. This effectively provides a bias voltage for the cascode transistors 232 and 248. In a similar manner, the P-channel cascode transistors 236 and 252 are biased through a bias leg configured of an N-channel transistor 276 having the gate thereof connected to node 266, the source thereof connected to ground and the drain thereof connected to node 240. Two series-connected P-channel transistors 278 and 280 have the source/drain paths thereof connected together and the gates thereof connected to node 240, with transistor 278 being a diode-configured transistor. The other side of the source/drain paths of transistors 278 and 280 are connected to the power supply terminal.

The common-mode voltage in the preferred embodiment is available on node 266. This voltage is the input voltage on nodes 61 and 64 that would keep the output node 90 and 104 at mid-supply. Since the input transistors 230 and 246 have the sources thereof connected to ground, the gate voltage of transistor 268 will comprise the gate voltage for transistors 230 and 246, such that the current through transistors 230 and 246 will be similar to the current through transistor 268, it being noted that the current through transistor 268 is defined in part by the current through transistor 262 and the ratio of the transistor 262 to the transistor 264. In the preferred embodiment, transistor 262 has a width of 50 and a length of 1.5, whereas transistor 264 has a width of 100 and a length of 1.5, transistor 264 being a larger transistor.

It can be seen by comparing the embodiment of FIG. 8 and the embodiment of FIG. 7 that the "head room" of the embodiment of FIG. 8 is larger than that of the embodiment of FIG. 7. This is due to the fact that there are three transistors disposed between each of the respective output terminals 90 and 104 and ground or the power supply rail. Therefore, when all three N-channel transistors between either of the output terminals and ground are turned on to pull the terminal low, the voltage will be the sum of the $V_{on}$ voltages of the transistors. Therefore, the embodiment of FIG. 8 will have one less transistor between the output terminal and the positive power supply rail or ground. However, in either of the embodiments of FIG. 7 or FIG. 8, the noted difference is that the bias points are not set with the use of a common-mode feedback scheme. The technique, as described hereinabove, is to set the bias on the input during the reset phase (ϕ1) with the input bias point set to roughly one $V_{gs}$ of a CMOS transistor with the output reset to roughly a mid-supply voltage.

Figure 9:
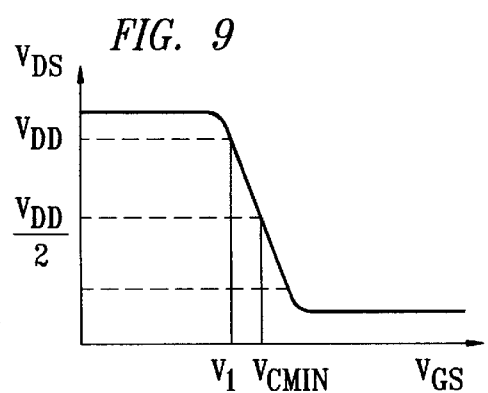
FIG. 9 illustrates a plot of the gate-to-source voltage and the drain-to-source voltage.

Referring now to FIG. 9, there is illustrated a plot of the gate-to-source voltage and the drain-to-source voltage. It can be seen that the transistor will not begin to conduct until the $V_{gs}$ rises above the threshold voltage $V_T$. At this time, the voltage will fall down to a low voltage which will be a saturated state. However, when the transistor operates in a linear mode, wherein, if the $V_{gs}$ is set to $V_{cmin}$, this will result in the output voltage being roughly mid-range. This, of course, is precisely what common-mode feedback attempts to achieve. In a switched capacitor configuration, it is only necessary that the bias conditions be met for the operational time during the ϕ2 clock cycle, i.e., the gain/ DAC phase. This, as noted, is set during the reset portion under control of the ϕ1 clock cycle.

Although the interstage amplifier 28 is described as being clocked in a reset cycle by the ϕ1 clock cycle and the gain/DAC phase with the ϕ1 clock cycle, it should be understood that alternating stages are operated with the inverse clock cycle; that is, when one stage is being reset, the next adjacent stage is operating in the gain/DAC phase, such that the ϕ1 phase is the reset phase for one converter stage and the gain/DAC phase for the next converter stage 10, and so on.

In summary, there has been provided a pipelined ADC having a plurality of pipelined converter stages, each stage operable to generate a local digital code and a residue, the residue being provided as the input to the next adjacent stage. The local codes are output to a digital correction logic circuit. Each of the stages includes an interstage amplifier which receives on the input thereof both the input signal and the output of a reconstruction DAC to provide an analog residue output. This interstage amplifier is implemented with a switched capacitor configuration without utilizing common-mode feedback. In order to facilitate the lack of common-mode feedback, the bias points for the amplifier are preset during a reset operation and, during a gain/DAC operation, the input is summed with the negative of the reconstruction DAC output and then amplified and transferred over to the next converter stage 10 as the residue.

Although the preferred embodiment has been described in detail, it should be understood that various changes, substitutions and alterations can be made therein without departing from the spirit and scope of the invention as defined by the appended claims. It should be understood that an ADC can be fabricated utilizing stages having a gain that is different than two. It is also understood that the actual topology of the amplifier can be modified.

What is claimed is:

1. A pipelined analog-to-digital converter, comprising:
    a plurality of converter stages, each for receiving a differential analog input signal and generating a local digital code representing a coarse digital value of the differential analog input signal and generating a differential analog residue output signal that represents the difference between the received differential analog input signal and an analog representation of the coarse digital value;

a digital correction circuit for receiving all said local digital codes from each of said converter stages and generating the digital output of the pipelined analog-to-digital converter as a weighted sum of the local digital codes for all of said stages;

each of said converter stages including a sample/hold interstage differential amplifier, said interstage differential amplifier having a reset phase with sampling circuitry for sampling the differential analog residue signal during the reset phase, and a gain phase, said interstage differential amplifier having a differential input for receiving the unamplified differential analog residue signal generated internal to said converter stage during the reset phase for sampling thereof, and operating in the gain phase to amplify the sampled differential analog residue signal to provide gain thereto, said interstage differential amplifier having a common-mode bias circuit for setting the input bias voltage level thereto only during the reset phase;

a first sampling capacitor connected between said positive differential input of said interstage differential amplifier and a first switching node;

a second sampling capacitor connected between said negative differential input of said interstage differential amplifier and a second switching node;

a first switch connected between said first switching node and the positive analog input signal to said interstage differential amplifier and conducting only during said reset phase;

a second switch connected between said second switching node and the negative analog input signal and conductive only during said reset phase, said second switch isolating the other side of said feedback capacitors from the respective one of said outputs;

a third switch connected between said first and second switching nodes and conductive only during said gain phase, such that my common-mode components impressed upon the analog input signal will be removed prior to input to said interstage differential amplifier;

a first DAC capacitor connected between said positive differential input of said interstage differential amplifier and a first switching network;

a second DAC capacitor connected between said negative differential input of said interstage differential amplifier and a second switching network; and a switching network control circuit for controlling said first and second switching networks to connect one of a plurality of predetermined reference voltages to the other side of said first and second DAC capacitors from said positive and negative differential inputs, respectively, in accordance with the value of said associated local code to effectively sum the analog representation of the local code with the positive and negative differential inputs such that said first and second DACs are separate from said first and second sampling capacitors.

2. The converter of claim 1, wherein said interstage differential amplifier has associated therewith positive and negative differential outputs and said common-mode bias circuit is also operable to set the output bias voltage during said reset phase on each of said positive and negative differential outputs.

3. The converter of claim 2, wherein said interstage differential amplifier includes a first gain leg for amplifying the positive differential input and a second gain leg for amplifying the negative differential input signal thereto.

4. The converter of claim 3, wherein said first and second gain legs are connected together at one end to a common node and through a current source, such that the sum of the current through each of said first and second gain legs equals the current through said current source, such that a differential input amplifier is provided.

5. The converter of claim 2, wherein said interstage differential amplifier includes a feedback capacitor associated with each of said positive and negative differential inputs with one end of each of said feedback capacitors connected to the associated one of said positive and negative differential inputs and the output thereof connectable to the associated one of the positive and negative outputs of said interstage differential amplifier, said bias circuit comprising:

a first switch network for connecting said positive and negative differential inputs to a common-mode input voltage reference, said first switch network providing a bias point to said positive and negative inputs;

a second switch network for connecting the other side of each of said feedback capacitors associated with said positive and negative differential inputs to a common-mode output voltage reference to set the bias output level of said interstage differential amplifier during said gain phase; and a switch control network for connecting said common-mode input voltage reference and said common-mode output voltage reference through the respective ones of said first and second switch networks only during said reset phase.

6. The converter of claim 1, wherein said interstage differential amplifier has associated therewith positive and negative differential inputs, and said common-mode bias circuit includes a voltage generator for generating a common-mode input voltage reference level and a switching circuit for connecting said common-mode input voltage reference to said positive and negative differential inputs during said reset phase.

* * * * *